United States Patent [19]

Kinoshita et al.

[11] Patent Number: 4,870,495

[45] Date of Patent: Sep. 26, 1989

[54] IMAGE SENSING ELEMENT AND IMAGE SENSING APPARATUS FOR RECORDING A STILL IMAGE

[75] Inventors: Takao Kinoshita, Tokyo; Akihiko Tojo; Akira Suga, both of Yokohama, all of Japan

[73] Assignee: Canon Kabushiki Kaisha, Tokyo, Japan

[21] Appl. No.: 828,177

[22] Filed: Feb. 11, 1986

[30] Foreign Application Priority Data

Feb. 22, 1985 [JP] Japan ................................ 60-034780
Jan. 20, 1986 [JP] Japan ................................ 61-10384

[51] Int. Cl.$^4$ ............................................. H04N 3/14
[52] U.S. Cl. ........................... 358/213.28; 358/213.15; 358/44
[58] Field of Search ............... 358/44, 43, 41, 213, 358/213.25, 213.23, 213.28, 213.26, 213.29

[56] References Cited

U.S. PATENT DOCUMENTS

| | | |
|---|---|---|
| 3,848,083 | 11/1974 | Townsend . |
| 3,911,479 | 10/1975 | Sakurai ................................ 358/44 |
| 4,001,878 | 1/1977 | Weimer . |
| 4,042,956 | 8/1977 | Yamanaka ...................... 358/44 X |
| 4,054,906 | 10/1977 | Yamanaka ...................... 358/44 X |
| 4,064,532 | 12/1977 | Yamanaka ...................... 358/44 |
| 4,069,501 | 1/1978 | Yamanaka ...................... 358/44 |
| 4,071,853 | 1/1978 | Yamanaka ...................... 358/44 X |
| 4,101,929 | 7/1978 | Ohneda et al. ................. 358/44 |
| 4,179,706 | 12/1979 | Nishimura et al. ............. 358/44 |
| 4,242,700 | 12/1980 | Weimer ............................ 358/44 |
| 4,513,313 | 4/1985 | Kinoshita et al. .............. 358/44 |
| 4,558,365 | 12/1985 | Ochi ................................ 358/44 X |
| 4,570,178 | 2/1986 | Morimura et al. .............. 358/44 |
| 4,641,183 | 2/1987 | Kinoshita ....................... 358/44 |
| 4,646,139 | 2/1987 | Takei et al. .................... 358/43 X |
| 4,649,430 | 3/1987 | Hynecek ....................... 358/213.25 X |
| 4,660,090 | 4/1987 | Hynecek ....................... 358/213.25 X |
| 4,720,746 | 1/1988 | Moore ........................... 358/213.28 |
| 4,737,841 | 4/1988 | Kinoshita et al. ............. 358/44 |

FOREIGN PATENT DOCUMENTS

| | | |
|---|---|---|
| 1487803 | 2/1969 | Fed. Rep. of Germany . |
| 2514156 | 10/1975 | Fed. Rep. of Germany . |
| 2553686 | 10/1976 | Fed. Rep. of Germany ........... 358/213.23 |
| 2652710 | 5/1977 | Fed. Rep. of Germany . |
| 3021470 | 12/1980 | Fed. Rep. of Germany . |
| 3144163 | 6/1982 | Fed. Rep. of Germany . |
| 52-043318 | 5/1977 | Japan ............................... 358/213.27 |
| 58-087976 | 5/1983 | Japan ............................... 358/213.18 |
| 231982 | 12/1984 | Japan ............................... 358/213.23 |
| 60-005683 | 1/1985 | Japan ............................... 358/213.27 |

Primary Examiner—James J. Groody
Assistant Examiner—Mark R. Powell
Attorney, Agent, or Firm—Fitzpatrick, Cella, Harper & Scinto

[57] ABSTRACT

An image sensing element according to the invention has a plurality of pixels arranged in the row and column directions to sense an optical image. The respective pixels are mutually deviated by an amount of ½ pitch with respect to the adjacent rows. Color filters are arranged for the respective pixels. These color filters are mutually deviated by an amount of 180° of the phase with regard to the vertical adjacent rows. Each pixel includes at least a transfer electrode formed of polysilicon having a thickness of not larger than 300 Å. An image sensing apparatus has a signal source for supplying transfer signals to the transfer electrodes a plurality of times to transfer the charges of one pixel; a shutter for shielding the image sensing element against the light; and a control circuit for reading out the image sensing information of the page sensing element for the field period and exposing this element for the image sensing period and shielding the imaging section against the light by the shutter for at least the readout period. Thus, a simple image sensing element having a good yield and an image sensing apparatus using this element can be obtained.

10 Claims, 13 Drawing Sheets

IMAGE SENSING ELEMENT AND IMAGE SENSING APPARATUS FOR RECORDING A STILL IMAGE

FILED OF THE INVENITON

The present invention relates to an image sensing element and an image sensing apparatus which are suitable to record a still image.

BACKGROUND OF THE INVENTION

In conventional image sensing apparatus, image sensing elements have many limitations to obtain an image sensing outputs synchronized with a standard television signal. For example, since the image sensing must be continuously performed at every 1/60 second, the image sensing element using a CCD needs a storage section for a buffer memory. Therefore, this results in an increase in scale of the element, a deterioration of the yield, and an increase in costs. On the contrary, a demand for a still image sensing apparatus using a solid state image sensor has recently been increasing and a high resolution commensurate with that in still image sensing using a silver salt film is also demanded.

It is at present extremely difficult to obtain such a high resolution.

SUMMARY OF THE INVENTION

It is an object of the present invention to obtain an image sensing element and an image sensing apparatus for use in still image sensing in which a high resolution is obtained.

Another object of the invention is to provide an image sensing element and an image sensing apparatus in which little moire is produced.

Still another object of the invention is to provide an image sensing element and an image sensing apparatus in which variation in sensitivity is unlikely to occur.

Still another object of the invention is to provide an image sensing element and an image sensing apparatus in which sensitivity is high.

Still another object of the invention is to provide an image sensing apparatus which can prevent moire in the vertical direction by means of a simple construction.

According to an image sensing element of an embodiment of the present invention, to accomplish the above objects, in an image sensing element which has a plurality of pixels arranged in the row and column directions to sense an optical image and in which a charge shift register is constituted by the pixels in the same column direction, the charge shift register is constituted in a manner such that the centers of sensitivities of the pixels meander in the horizontal direction by only an amount of ½ pixel for each pair of adjacent rows, so that a high resolution can be obtained and little moire occurs.

According to an image sensing element of another embodiment of the invention, this element comprises: a plurality of charge transfer means arranged in parallel each having a photoelectric converting function. A zigzag separating means separates the respective charge transfer means and the a width of each of those charge transfer means cyclically varies due to the separating means. A first electrode is provided at the center of the relatively wide portion in each of the charge transfer means and a second electrode is provided in the relatively narrow portion in each of the charge transfer means. As a result, even if a sensitivity variation occurs due to the first electrode in each pixel which is formed in the wide portion, its influence is small.

According to an image sensing element of still another embodiment of the invention, this element has a plurality of pixels arranged in the row and column directions to sense an optical image. The respective pixels are deviated by an amount of ½ pitch with respect to the adjacent rows. Color filters are arranged for the respective pixel, and are each constituted by three repetitive colors in the horizontal (now) direction. The color filters are arranged so as to be deviated by an amount of 3/2 pitch with regard to the adjacent rows in the vertical (column) direction. Therefore, the chrominance signals are mutually interpolated with regard to the column direction, so that it is less likely to generate pseudochrominance signals.

According to an image sensing apparatus of another embodiment, this apparatus has charge transfer channels including a plurality of cells and transfer electrodes and a signal source for supplying transfer signals to the transfer electrodes a plurality of times in order to transfer the charges of one cell by the transfer channel, so that the thickness of the electrode can be reduced and the sensitivity is improved.

According to an image sensing element of still another embodiment of the invention, this element comprises zigzag separating means for separating respective charge transfer means, an electrode for separating the charge transfer means into a plurality of pixels and another electrode, for controlling an internal potential in substantially the central portion of each of those pixels. Therefore, a sensitivity variation in the pixel is unlikely to occur and a high resolution can be obtained by the cahrge transfer means of a simple constitution.

According to still another embodiment of the invention, in an image sensing element which has a plurality of pixels arranged in the row and column directions to sense an optical image and in which a charge shift register is constituted by the pixels in the each column this charge shift register being constituted in a manner such that the centers of sensitivities of the pixels meander in the horizontal direction by only an amount of ½ pixel for every pair of adjacent rows. In addition, an optical low-pass filter arranged in front of the image sensing element is provided and this low-pass filter is constituted such as to gradate the optical image only in the vertical direction with respect to the row direction. Therefore, moires in both the horizontal and vertical directions of the image sensing element can be prevented by the low-pass filter with a simple constitution.

The above and other objects and features of the present invention will become apparent from the following detailed description and the appended claims with reference to the accompanying drawings.

DETAILED DESCRIPTION OF THE PREFERRED EMBODIMENTS

The present invention will now be described in detail herein below with reference to the drawings.

Figure 1:
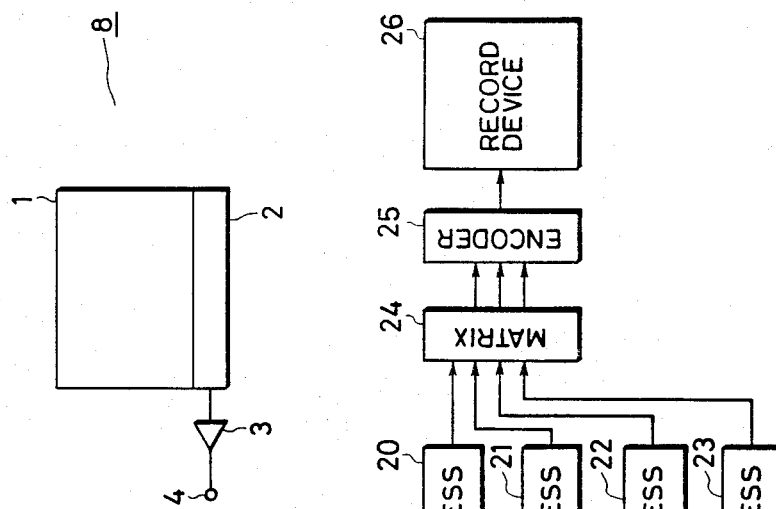
FIG. 1 is a diagram showing an example of the fundamental arrangement of an image sensing element according to the present invention.

FIG. 1 is a diagram showing a schematic arrangement of an image sensing element 8 of the present invention, in which reference numeral 1 denotes an imaging section, 2 is a horizontal shift register, 3 is an output amplifier, and 4 is an output terminal.

As shown in the diagram, it is a feature of the image sensing element 8 that it has no storage section for a buffer memory.

Figure 2:
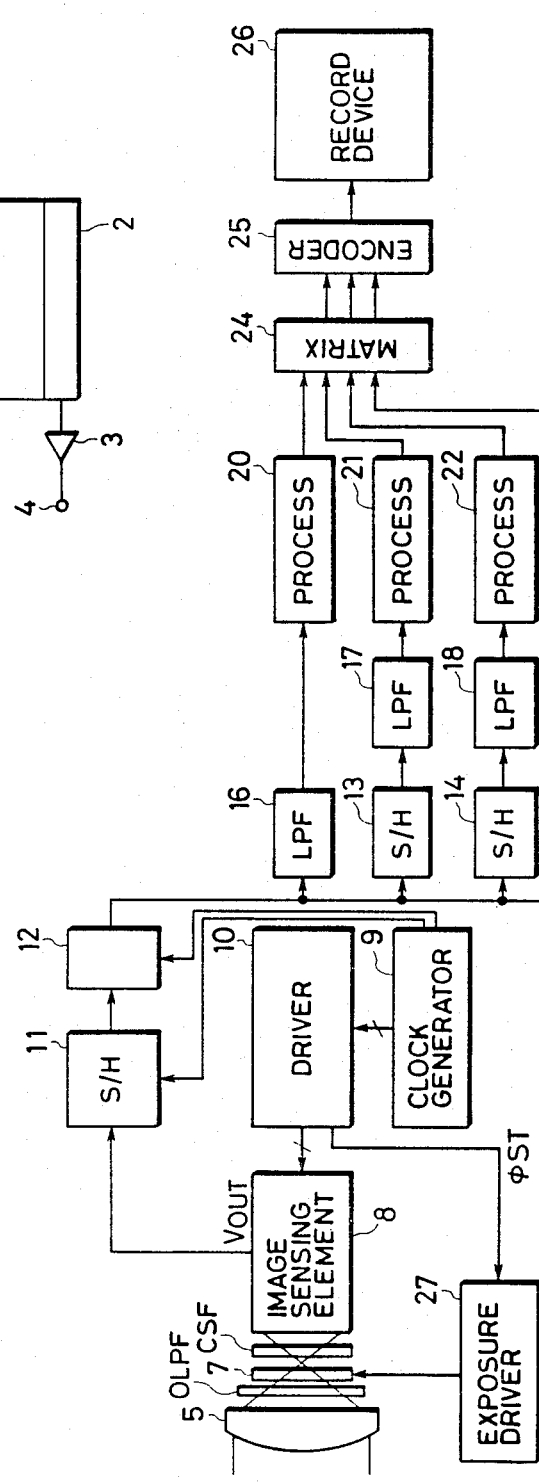
FIG. 2 is a diagram showing an example of the fundamental arrangement of an image sensing apparatus according to the invention.

FIG. 2 is a diagram showing an example of an arrangement of an image sensing apparatus according to the invention. The light from an object is formed as an image on the image sensing element 8 through an image sensing optical system 5, an optical low-pass filter OLPF, an exposure mechanism 7 serving as light shielding means and consisting of an iris and a shutter, and a color separation filter CSF. A clock generator 9 serves as a signal source and generates various kinds of clock pulses. An output of the clock generator 9 is properly amplified by a driver 10 serving as control means and thereafter it is supplied to the image sensing element 8. Driving means is constituted by the clock generator 9 and driver 10.

With this arrangement, time sequential color signals of R, G and B are outputted from the image sensing element 8 as will be explained hereinafter.

Duty ratios of those time sequential color signals are increased by a sample and hold circuit 11, thereby making easy the sampling and holding with respect to each color which will be executed later.

A black level smear correcting circuit 12 clamps an electrical signal corresponding to a black level detecting section (not shown) of the image sensing element 8 such that its level becomes a predetermined black reference level.

Since the light shielded black level portion is provided at the end of the horizontal register of the image sensing section, a video signal which is obtained through the sample and hold circuit 11 is clamped directly or is clamped in a feedback manner such that its level becomes the reference level during the horizontal blanking period. Thus, a dark current can be compensated for.

Numerals 13 to 15 denote sample and hold (S/H) circuits to perform the sampling and holding with regard to each color. These S/H circuits sample the dot sequential color signals at the period corresponding to the color repetitive period of the color filter and at the phase of each color.

Numerals 16 to 19 denote low-pass filters (LPFs). The LPF 16 has a cut-off frequency of, e.g., about 3 MHz. The LPFs 17 to 19 have cut-off frequencies of, e.g., about 500 kHz.

Processors 20 to 23 execute various kinds of corrections such as gamma ($\gamma$) correction, white clipping, APC (aperture compensation), etc. to the signals which are obtained through the LPFs 16 to 19, respectively.

A matrix circuit 24 forms luminance signals of, for example, Y, R-Y, and B-Y, and a color difference signal from respective signals of Y, B, G and R derived through the processors 20 to 23.

An encoder 25 forms a standard television signal such as an NTSC signal using the above-mentioned luminance signals and color difference signal.

A recording device 26 records the standard television signal.

An exposure driver 27 drives the exposure mechanism 7.

Figure 3:
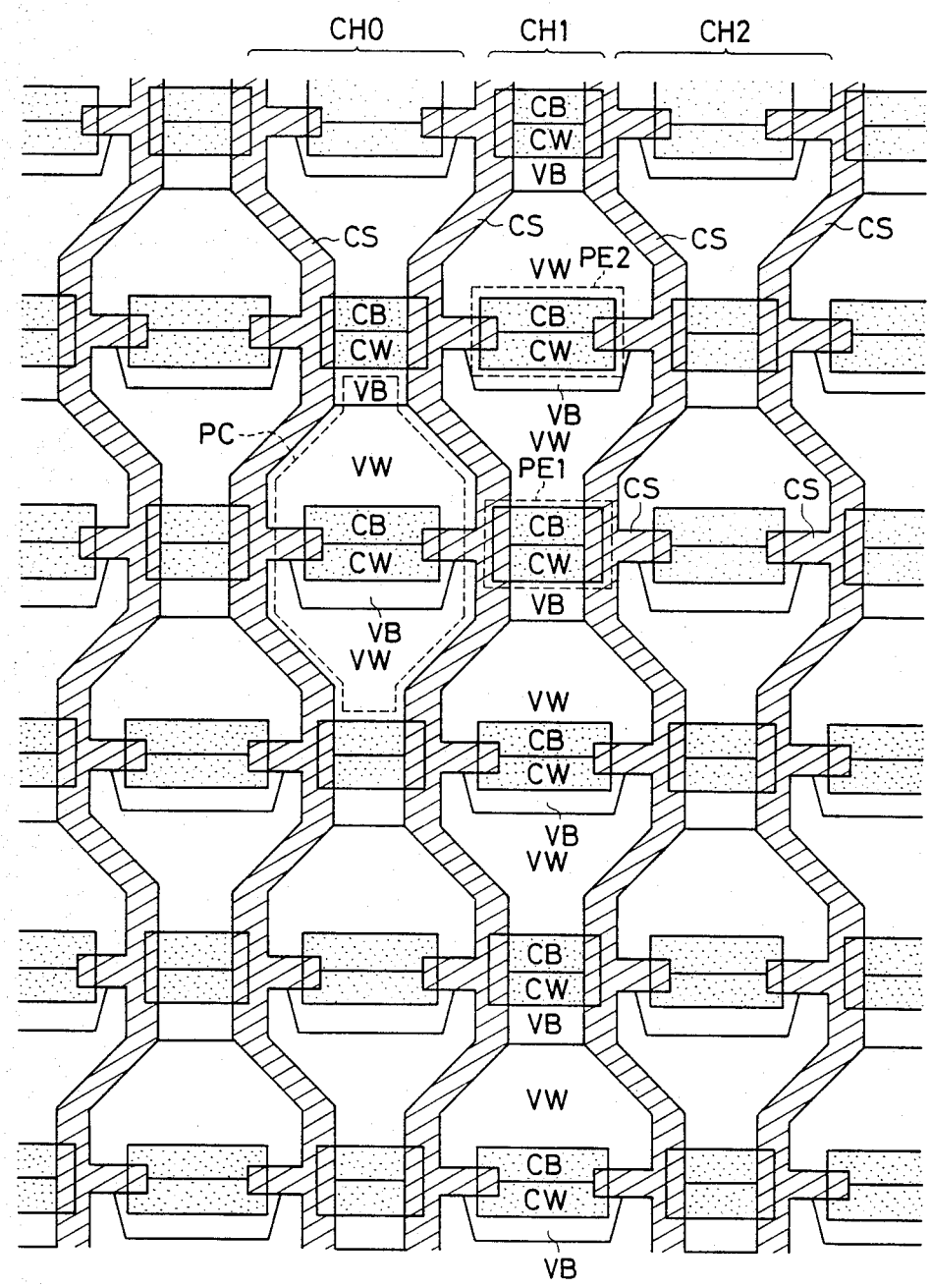
FIG. 3 is a diagram showing a first embodiment of an image sensing element of the invention.

FIG. 3 is a diagram showing an example of an electrode pattern of the imaging section 1 of the image sensing element 8 of the invention. In this embodiment, the imaging section 1 has a CCD structure.

In FIG. 3, CS denotes channel stop areas which serve to separate charge transfer channels $CH_0$, $CH_1$, $CH_2$, ...

CB and CW represent driving areas of the potentials. A driving electrode $PE_1$ or $PE_2$ is arranged on the surfaces of the areas CB and CW from which it is separated by an insulation layer. The driving electrode $PE_1$ has such a thickness that its resistance is sufficiently small with respect to a frequency of not higher than about 100 kHz. In the case of polysilicon, the electrode $PE_1$ has a thickness of about 500 Å or more. On the other hand, the driving electrode $PE_2$ has such a thickness that its resistance is small with respect to a frequency of not higher than a few MHz. In the case of polysilicon, the electrode $PE_2$ has a thickness of not smaller than about 3000 Å. VB and VW denote areas where the potential levels are fixed. The potentials in these areas are not influenced by the voltage of the electrode $PE_1$ or $PE_2$ on the areas CB and CW.

Potentials are preliminarily formed in the areas CB, CW, VB and VW by means of ion implantation or the like, respectively. Assuming that their potential levels regarding electrons are P(CB), P(CW), P(VB) and P(VW), when a voltage of a low level is applied to the electrode $PE_1$ or $PE_2$, the relation of P(CB) > P(CW) > P(VB) > P(VW) is satisfied.

On the contrary, when a voltage of a high level is applied, the relation of P(VB) > P(VW) > P(CB) > P(CW) is satisfied.

Therefore, by alternately applying high-level and low-level voltages to the electrode $PE_1$, the charges in the transfer channels $CH_0$, $CH_1$, $CH_2$, etc. move downwardly in the diagram.

On one hand, by applying a recombination voltage higher than the foregoing high-level voltage to the electrode $PE_2$, the charges in excess of a predetermined amount among the charges in the lower portion of the area CW are recombined with the holes at the interface and are extinguished. Contrarily, by applying a low-level voltage to the electrode $PE_2$, the holes are connected to the region near the interface.

In this way, by alternately applying the low-level voltage and recombination voltage to the electrode $PE_2$, the excessive charges in an image sensing cell PC are removed, so that the occurrence of blooming is prevented.

Stripe filters of R, G, B, R, ... are arranged for the channels $CH_0$, $CH_1$, $CH_2$, ..., respectively. This filter pattern repeats in the horizontal direction.

Figure 4:
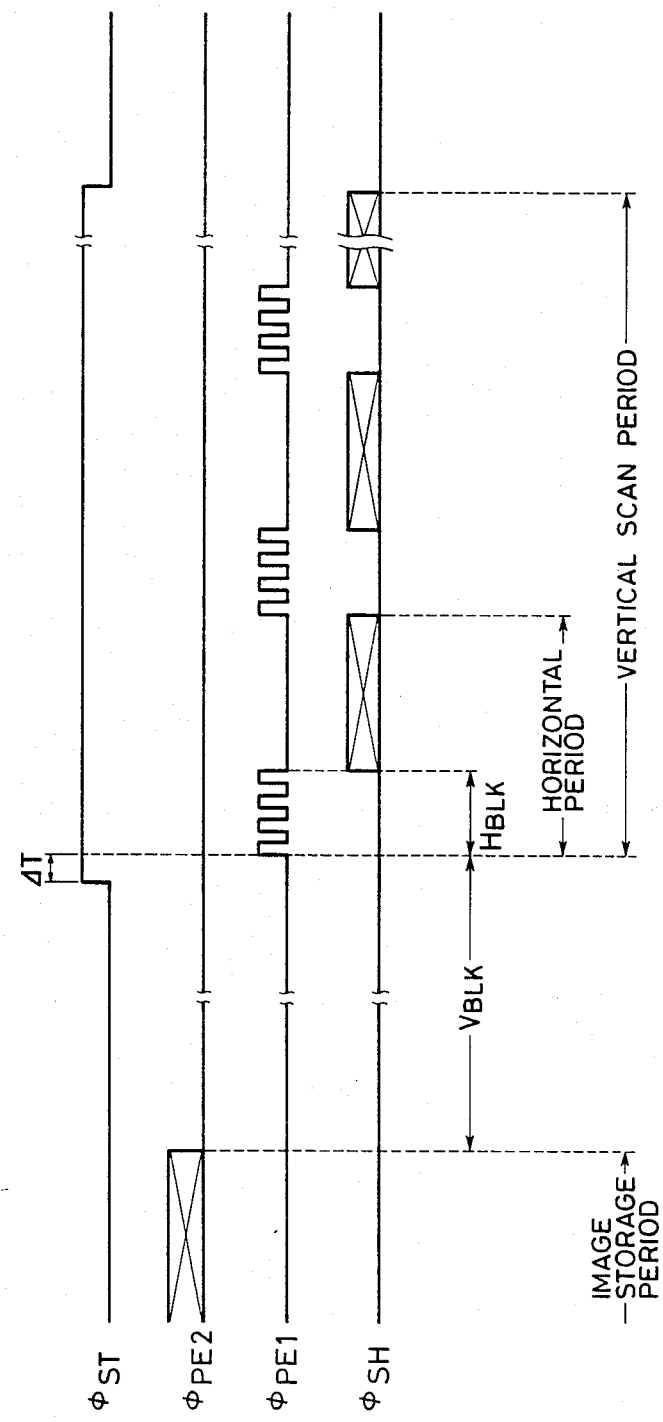
FIG. 4 is a diagram showing operation timings of the first embodiment.

FIG. 4 is a diagram showing examples of driving pulses which are supplied from the driver 10 to the image sensing element 8. $\phi_{PE1}$, $\phi_{PE2}$, and $\phi_{SH}$ denote pulses which are supplied to the electrodes $PE_1$ and $PE_2$ and horizontal shift register 2, respectively. $\phi_{ST}$ is a pulse to control the exposure driver 27.

As shown in FIG. 4, $\phi_{ST}$ is at a low level for the image storage period and the exposure mechanism 7 executes a predetermined exposure to the image sensing element.

An alternating signal of the recombination voltage and low-level voltage is supplied as $\phi_{PE2}$ at a relatively high frequency (e.g., 2 MHz).

Therefore, as mentioned above, the excessive charges generated in each pixel PC are soon extinguished.

After completion of the image storage period, the image sensing apparatus waits for the vertical blanking period to obtain synchronization with the recording device. Thereafter, $\phi_{ST}$ is set at a high level before the readout of the image signal of the imaging section is stored.

Due to this, the exposure mechanism operates such as to shut out the light incidence to the image sensing element.

The leading edge of $\phi_{ST}$ is set to a timing which is precedent to the start point of the readout by only the time of $\Delta T$ in consideration of the response time lag until the light shielding is actually performed.

Four pulses are supplied as $\phi_{PE1}$ at the start of the readout.

Thus, the potential levels of the areas CB and CW increase and decrease four times, so that the charges stored in each pixel PC are transferred by one stage downwardly in FIG. 3.

Therefore, the charges of the pixels of one row of each of the transfer channels $CH_0$, $CH_1$, $CH_2$, ... are stored into the corresponding transfer cells in the horizontal shift register 2, respectively.

Thereafter, the charges in the register 2 are read out by $\phi_{SH}$ for one horizontal scan period.

The image signal of one field can be obtained by repeating the operation to simultaneously transfer the charges of the pixel of each transfer channel by an amount commensurate with each row at a time for one vertical scan period as described above. This image signal is transmitted through various kinds of processors as shown in FIG. 2 and recorded by the recording device 26.

In the image sensing element 8 of the embodiment of the invention, pixels in the each transfer channel are deviated in the vertical direction by an amount of ½ pitch from those in the adjacent channel(s), and at the same time the sensitivity distributions of the sensitive pixels in the adjacent transfer channels are overlapped in the horizontal direction. Therefore, the following effects are derived.

Resolution in the horizontal direction is improved since the pixels of two rows which are vertically deviated by an amount of ½ pitch are simultaneously read out when the horizontal scanning line of one row is read out.

The MTF (modulation transfer function) is improved since the sensitivity distributions of the respective pixels in the adjacent transfer channels are horizontally overlapped.

High integration can be easily realized since the pixels are arranged so as to be deviated in the vertical direction by an amount of ½ pitch for every pixel instead of simply arranging the pixels the straight lines in the horizontal direction.

According to the embodiment shown in FIGS. 1 to 4, the following effects are also obtained.

In the case where such a pixel arrangement is used in the CCD structure, a part of the transfer channel is narrowed and transfer efficiency deteriorates, so that there is a drawback that the charges cannot be transferred at a high speed. However, according to this embodiment, the imaging section is shielded against light during the readout operation; therefore, there is no need to shift the charges in the imaging section to the memory section or the like at a high speed as in the case of the frame transfer type CCD. In addition, there is no need to provide a channel for a memory in the imaging section as in the case of the interline type CCD, so that an aperture ratio is improved. Also, a high resolution is derived.

On the other hand, in this embodiment, in order to transfer the charge of one pixel in each transfer channel, pulses are supplied to the transfer electrodes such that the transfer operation is executed a plurality of times, so that the charge transfer can be reliably carried out. Such transfer operations of a plurality of times can be realized since the high-speed transfer of the imaging section is unnecessary.

Further, this embodiment can also solve the following drawbacks in the image sensor of the single phase driving system.

In the conventional image sensor of the single phase driving system, a portion covered by the transparent transfer electrode and another portion exist in one pixel, so that a sensitivity variation occurs due to the transmission characteristic of the transfer electrode. Particularly, there is a drawback that the states of the sensitivity variations differ for every color and pseudo chrominance signals are caused. However, in this embodiment, to solve such drawbacks, the thickness of polysilicon of the transfer electrode $PE_1$ is set to a much thinner value than the conventional one, so that an influence of the sensitivity variation due to the transfer electrode is fairly small. In addition, since the electrode $PE_2$ is also arranged substantially at the center of the pixel, influence of the sensitivity variation is also small. On the contrary, when the transfer electrode of the imaging section is thinly formed as mentioned above the resistance of the electrode increases. Thus, in the conventional image sensor, response speed at high frequency decreases and transfer efficiency deteriorates since the high-speed transfer is needed. However, in this embodiment, such a thin electrode can be realized.

For example, the transfer electrode can be formed to have such a thickness (e.g., 500Å) that it has a satisfactorily small resistance value with respect to a frequency of not higher than 100 kHz.

Figure 5:
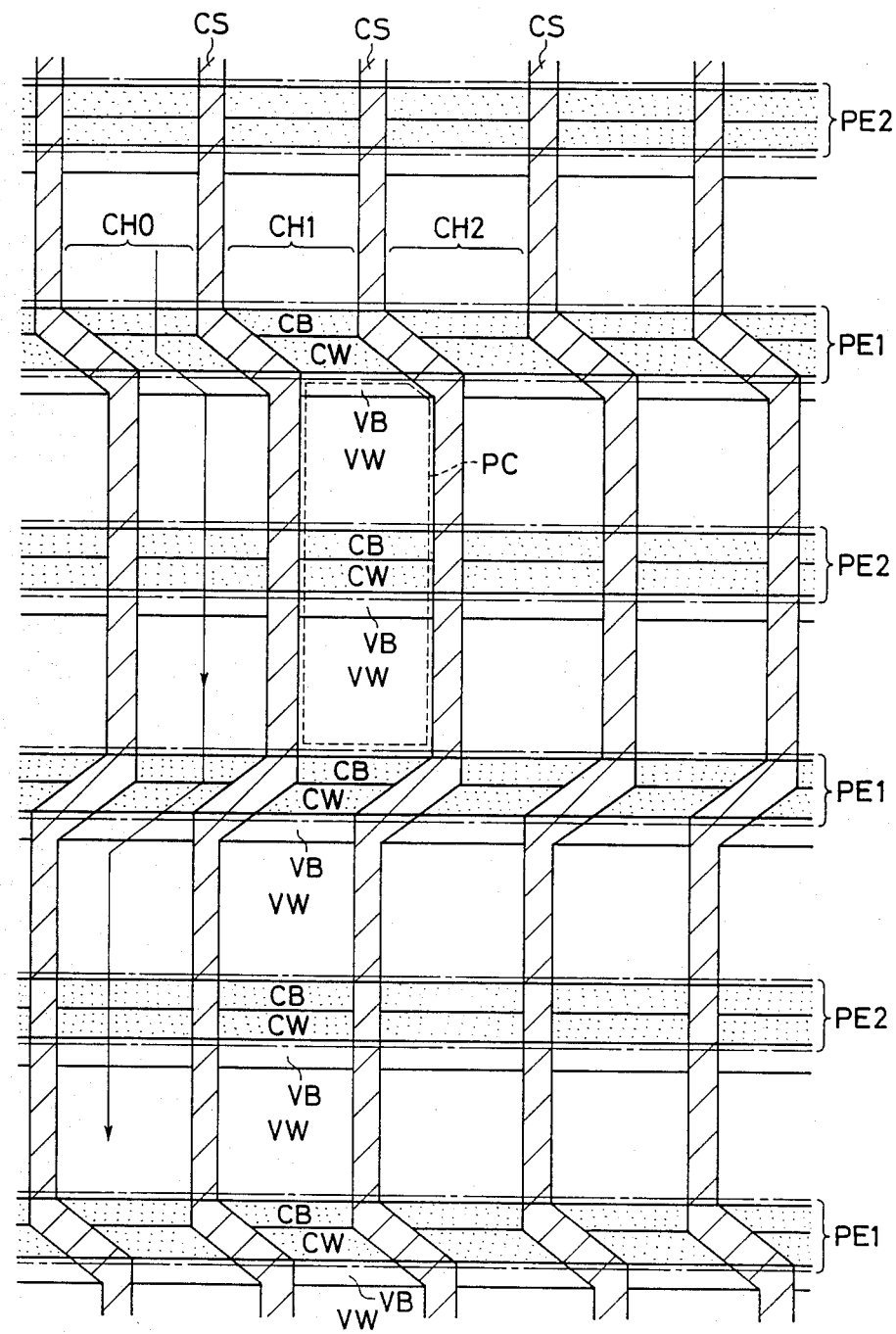
FIG. 5 is a diagram showing a second embodiment of an image sensing element of the invention.

FIG. 5 is a diagram showing a second embodiment of the invention. In the second embodiment, the respective transfer channels of the imaging section are deviated in the horizontal direction by only an amount of ½ pitch for every row. In FIG. 5, the same parts and elements as those shown in FIGS. 1 to 4 are designated by the same reference numerals.

With this arrangement, it is difficult to vertically transfer the charges at a high speed; however, no problem will be caused since high-speed transfer is unnecessary using the constitution such that the imaging section is light shielded during the readout operation as in the image sensing apparatus of the invention.

Also, by deviating the pixels PC by an amount of ½ pitch for every row, a high resolution can be obtained in the case of executing a vertical correlation process using the signals of two adjacent rows.

In addition, there is also an effect that a visual resolution is improved without performing a vertical correlation process.

Thus, the patterns of the electrodes $PE_1$ and $PE_2$ are simplified and the manufacturing process becomes easier as compared with the case of the electrode patterns of FIG. 3.

Figure 6:
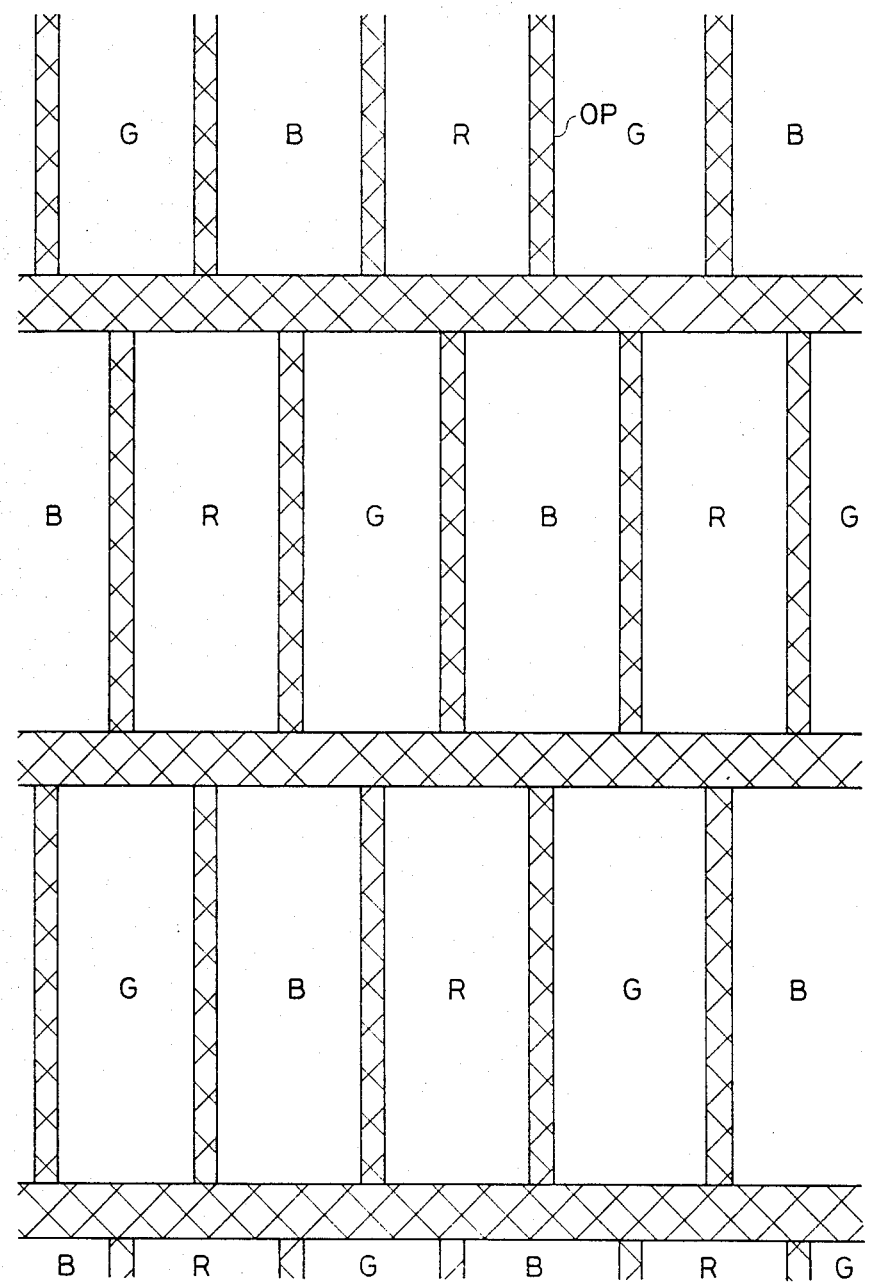
FIG. 6 is a diagram showing an example of a color filter suitable for the embodiment shown in FIG. 5.

FIG. 6 is a diagram showing an example of an arrangement of color filters which are arranged in front of the image sensor shown in FIG. 5, in which OP denotes a light shielding portion. One color filter corresponds to each pixel.

In addition, three kinds of color filters are repetitively arranged in the horizontal direction (i.e., in rows) in accordance with the sequence of, for example, R, G, B, R, G, . . . The color filters of the adjacent rows are deviated by an amount of 3/2 pitch.

Therefore, the color filters are mutually spatially interpolated with regard to the adjacent rows in the vertical direction.

Therefore, by executing the vertical correlation process, a resolution of a luminance signal can be improved.

Figure 7:
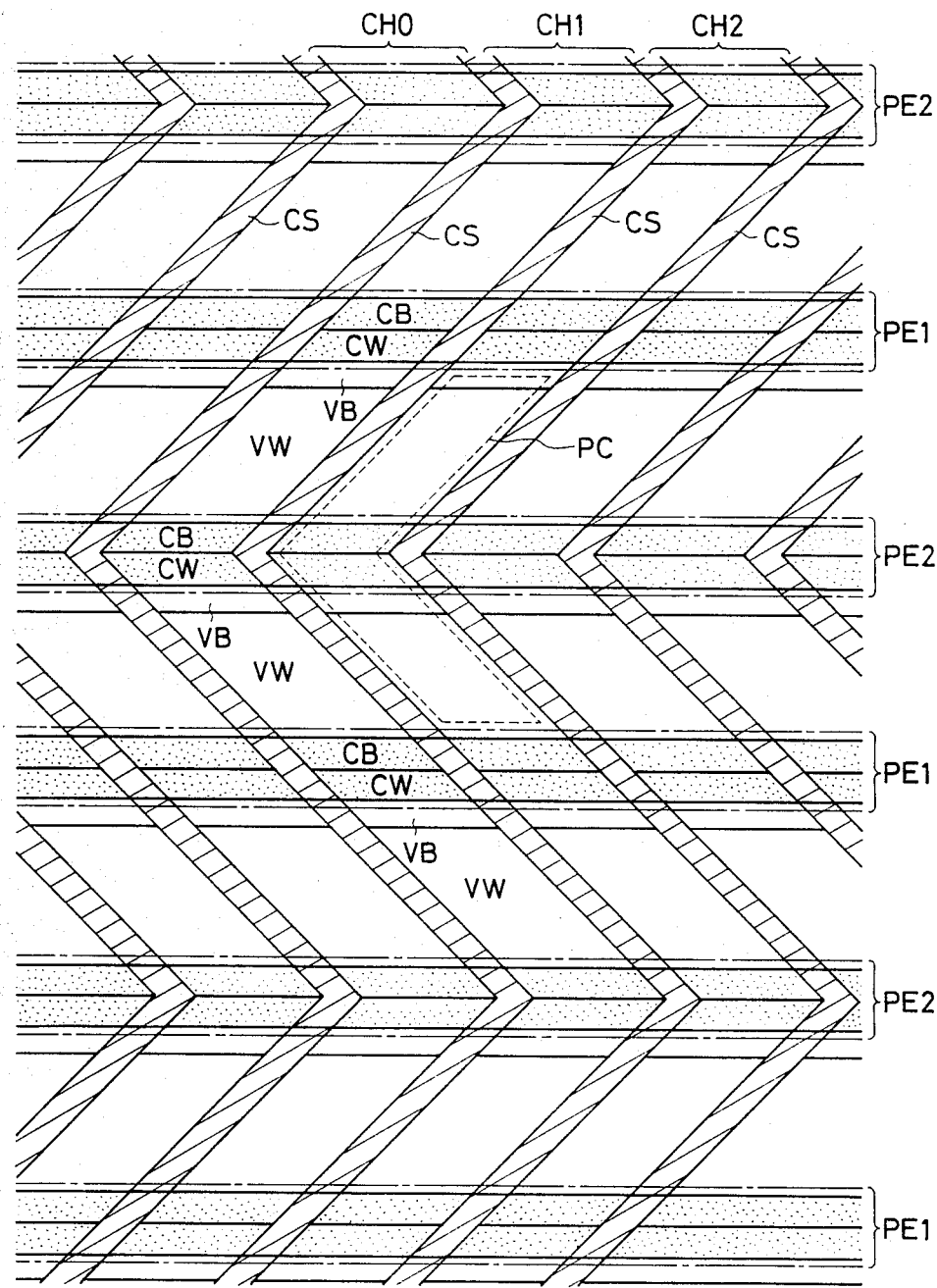
FIG. 7 is a diagram showing a third embodiment of an image sensing element of the invention.

FIG. 7 is a diagram showing an example of an electrode pattern of the imaging section in a third embodiment of the invention. In FIG. 7, the same parts and elements as those shown in FIGS. 1 to 6 are designated by the same reference numerals. The third embodiment is a modified form of the arrangement shown in FIG. 5. The sensitivity distributions of the adjacent pixels in the horizontal direction are overlapped in the horizontal and vertical directions, so that the MTF is improved and pseudo signals are reduced similarly to the arrangement shown in FIG. 3.

Figure 8:
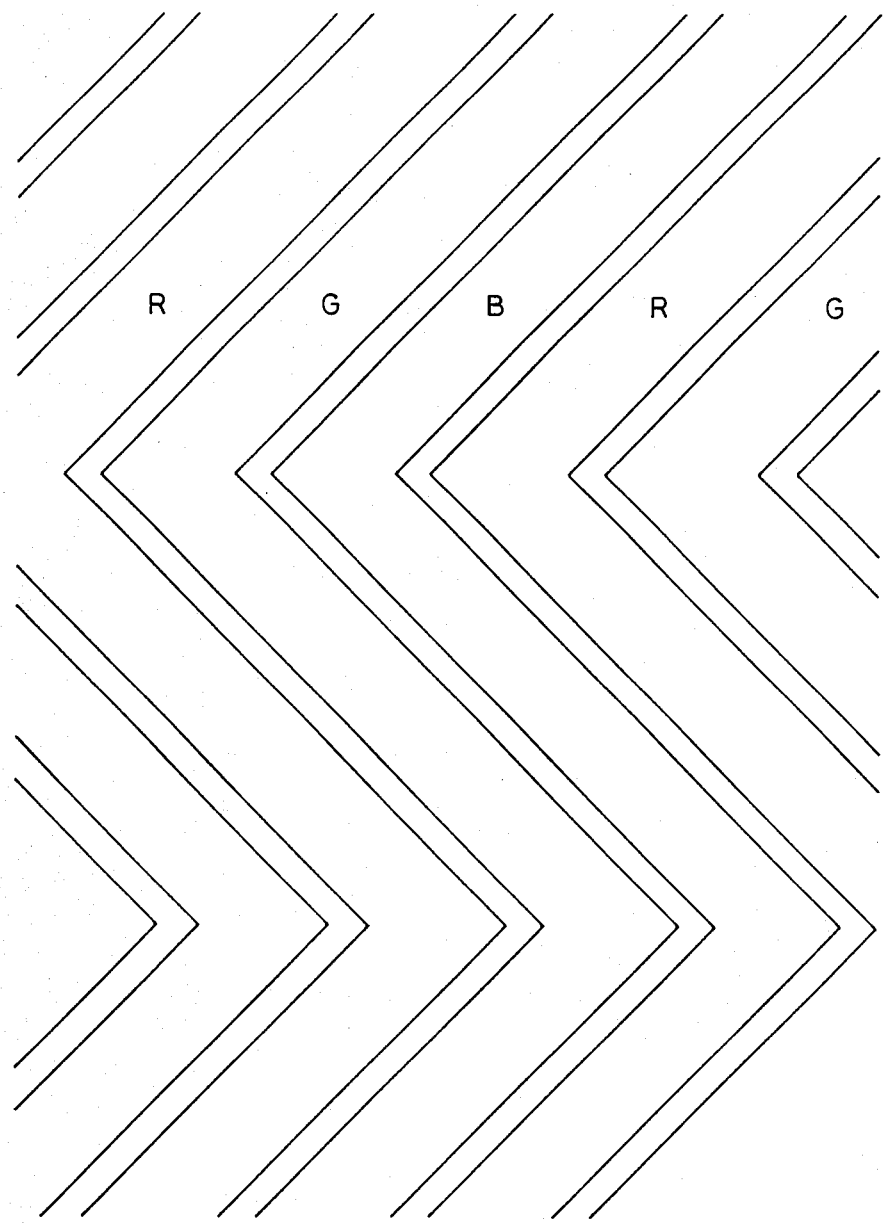
FIG. 8 is a diagram showing an example of a color filter suitable for the embodiment shown in FIG. 7.

FIG. 8 is a diagram showing a color filter pattern suitable for the electrode pattern shown in FIG. 7. In this embodiment as well, the filters are deviated by an amount of 3/2 pitch with regard to the adjacent rows in the vertical direction. Thus, an effect of high resolution is also obtained similarly to the case of the filters shown in FIG. 6; further, the pattern of the color filters can be simplified, resulting in the easy manufacturing process. In this embodiment, the chrominance signals can be easily separated as compared with the second embodiment. That is, in the second embodiment, the color separation timings of the color separating means such as the sample and hold circuits 13 to 15, and the like shown in FIG. 2 must be switched for every row. However, according to this embodiment, such a problem is not caused since the light transmitted through the same color filter is received by the same transfer channel.

Figure 9:
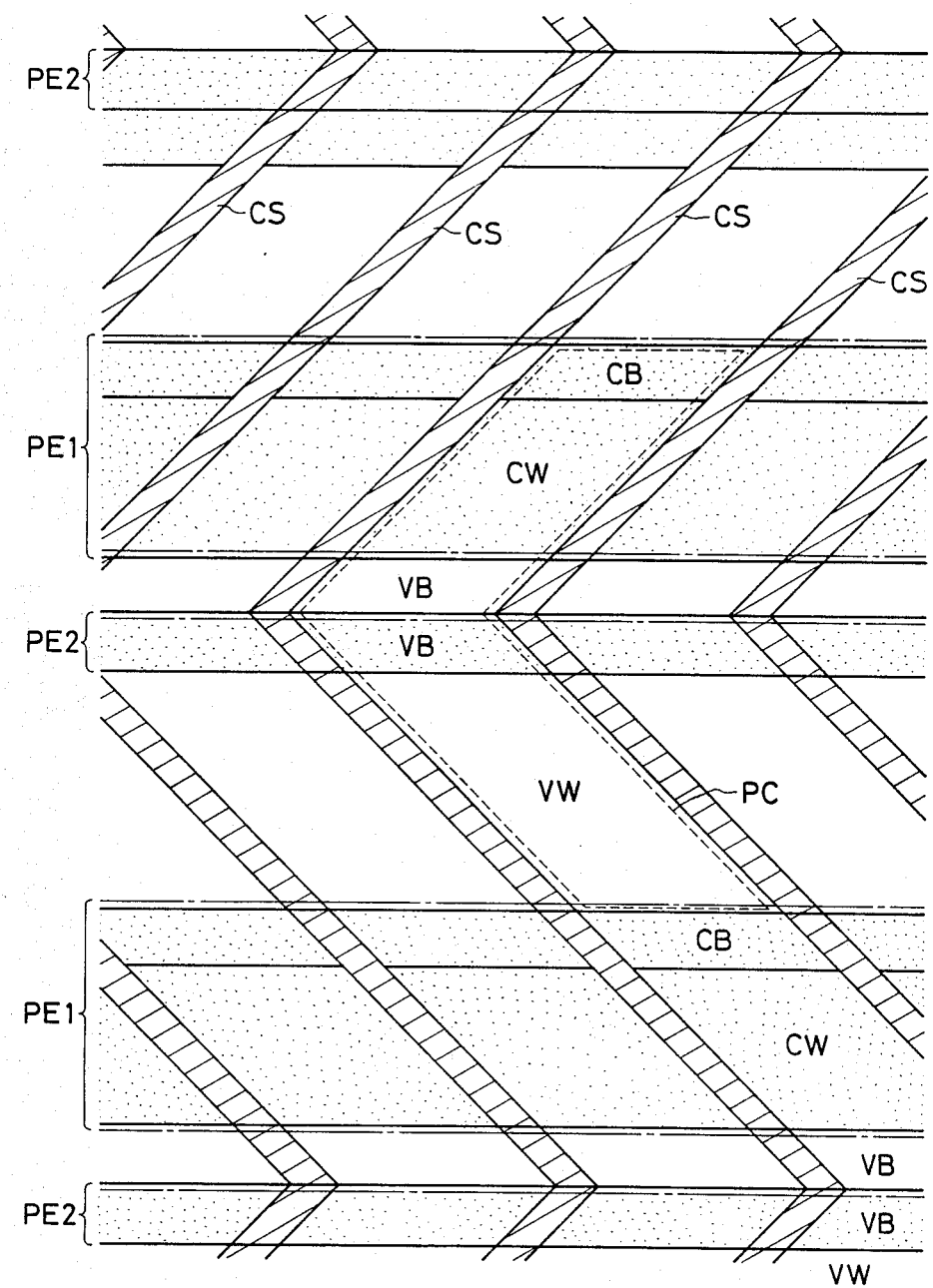
FIG. 9 is a diagram showing a fourth embodiment of an image sensing element of the invention.
Figure 10:
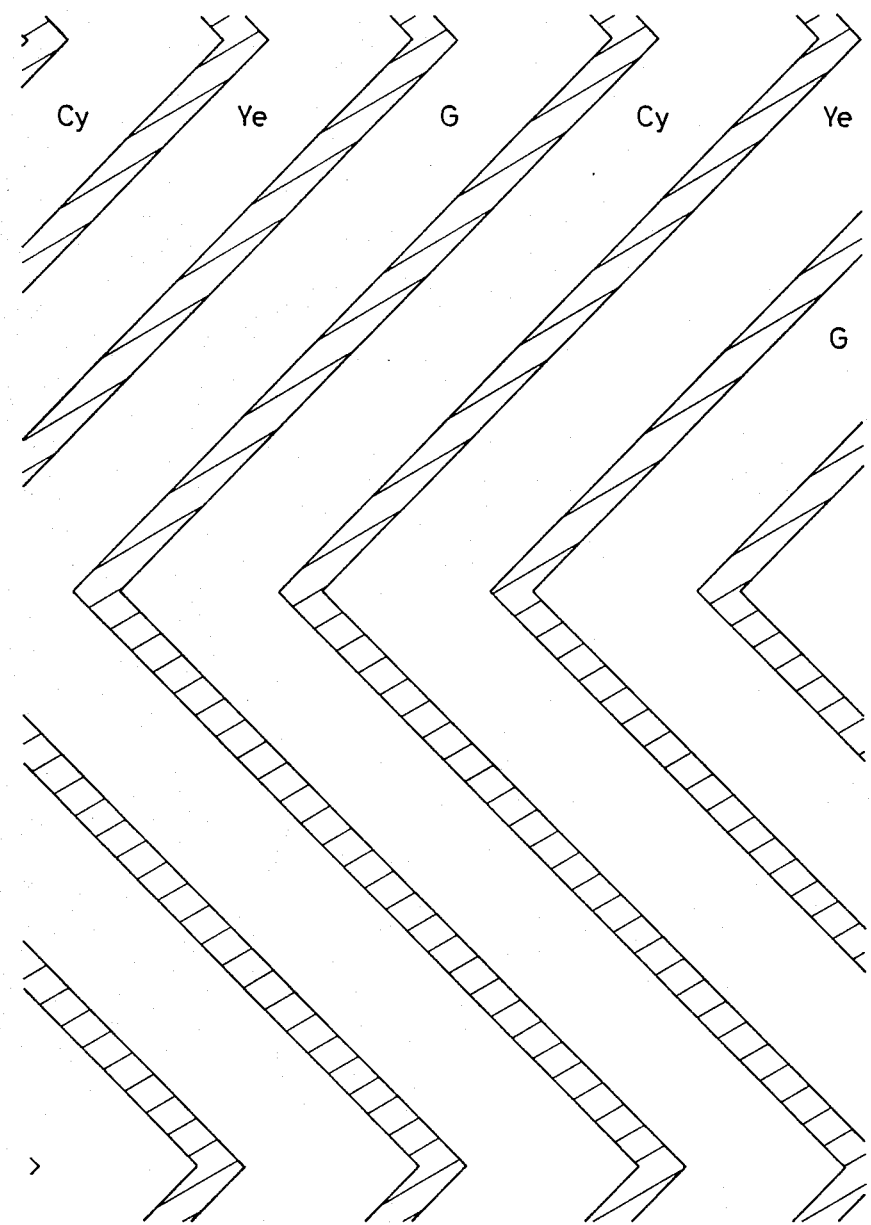
FIG. 10 is a diagram showing an example of a color filter suitable for the fourth embodiment of the invention.

FIG. 9 is a diagram showing a fourth embodiment of the invention. In this embodiment, the channel stop areas CS meander in the imaging section of the frame transfer type CCD of the conventional single phase driving system. Similarly to the embodiment shown in FIG. 7, the sensitivity distributions are overlapped in the horizontal and vertical directions with respect to the adjacent pixels in the horizontal direction, and the centers of sensitivities are deviated by an amount of 3/2 pitch with regard to the adjacent rows in the vertical direction. In addition, the filters as shown in FIG. 10 are arranged as the color filters. Although these filters are fundamentally the same as those shown in FIG. 8, Ye, G and Cy are used in the embodiment of FIG. 10 in place of R, G and B.

In FIG. 9, the electrode $PE_2$ serves to apply the voltage to a part of the area VB through the insulation layer and to alternately apply the recombination voltage and low-level voltage. Due to this, the excess charges can be extinguished.

In the embodiment of FIG. 9, the electrode $PE_1$ can be formed of thin polysilicon or the like of, e.g., 500Å, so that the sensitivity variation as mentioned before is less likely to occur.

The electrode $PE_2$ is constituted by an electrode of a low resistance such as polysilicon, silicide, or the like of, e.g., 3000Å in thickness. Therefore, a slight sensitivity variation occurs due to the electrode $PE_2$. However, according to this embodiment, since the electrode $PE_2$ having a low transmittivity is arranged in the central portion of the pixel PC, sensitivity variation is less likely to occur in at least the vertical direction.

In addition, since the electrode $PE_1$ is also arranged on one side in the upper half portion which is symmetrical with the lower half portion in the pixel PC, no sesitivity variation occurs in the horizontal direction, so that pairing or the like is unlikely to occur.

Figure 11:
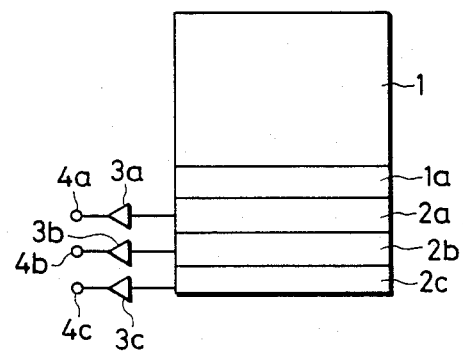
FIG. 11 is a diagram showing a fifth embodiment of an image sensing element of the invention.

With such arrangements of the second to fourth embodiments, the color image without moire can be obtained. FIG. 11 is a diagram showing a whole arrangement of an image sensing element suitable for the fourth embodiment. Reference numerals 2a to 2c denote horizontal shift registers to transfer the charges corresponding to the light of the same color in the imaging section 1, respectively.

Numeral 1a denotes a distributing section to distribute the charges of one row of the imaging section 1 to the horizontal shift registers 2a to 2c; 3a to 3c represent output amplifiers of the retisters 2a to 2c, respectively; and 4a to 4c are output terminals of the amplifiers 3a to 3c, respectively. Various kinds of methods of distributing the charges in the distributing section 1a are considered an example is shown in FIG. 12.

Figure 12:
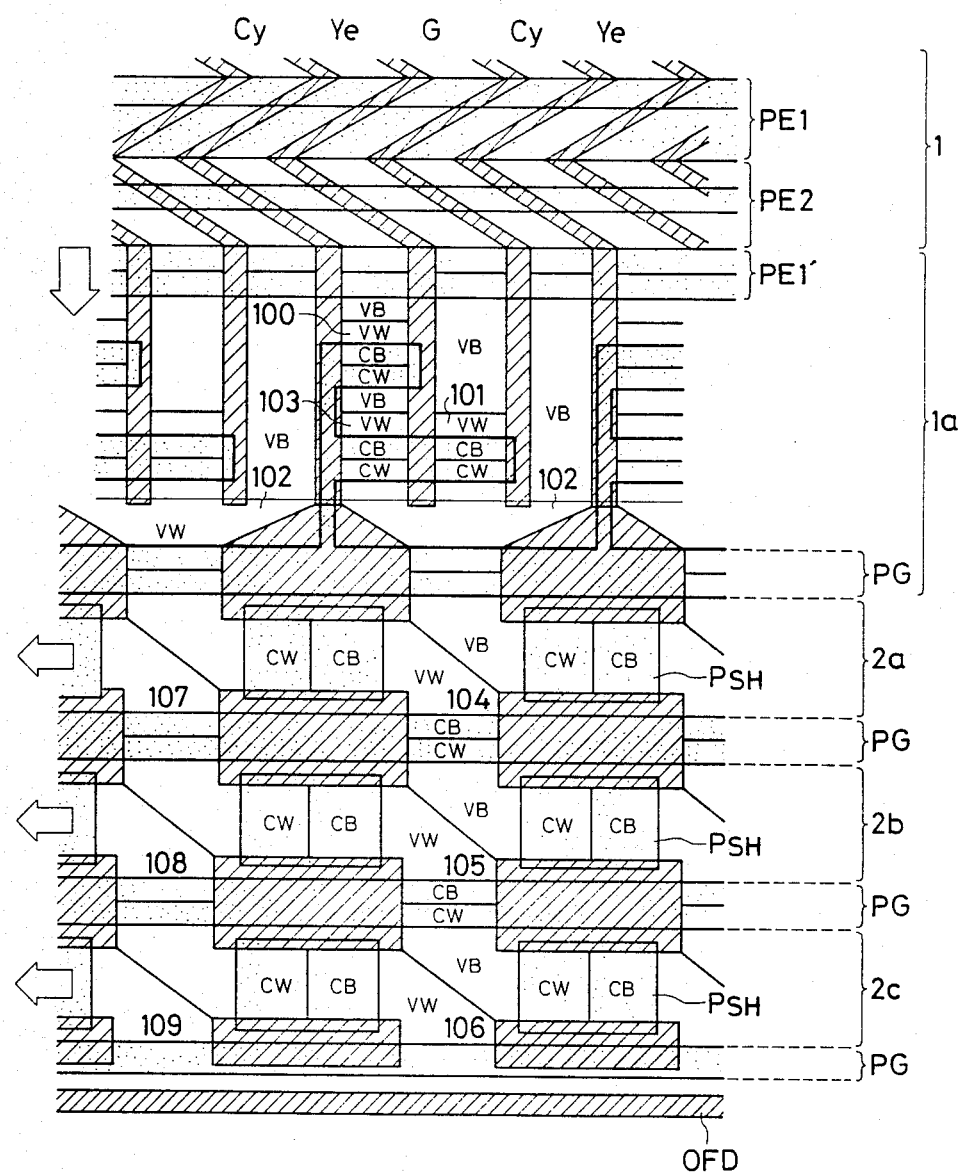
FIG. 12 is a diagram showing an electrode pattern of the main part in the fifth embodiment.

In FIG. 12, $PE_1'$ denotes an electrode to which the same voltage as that in the case of the electrode $PE_1$ is applied. The electrode $PE_1'$ is formed of polysilicon having a thickness of about 3000Å. PG indicates a gate electrode. Transfer electrodes are arranged for the areas CB and CW in the registers 2a to 2c through insulation layers, respectively. The common pulse $\phi_{SH}$ is supplied to transfer electrodes $P_{SH}$ of the horizontal shift registers 2a to 2c. The gate electrode PG and the transfer electrodes $P_{SH}$ of the registers 2a to 2c are also formed of polysilicon and have thicknesses of about 3000Å. With such an arrangement as shown in FIG. 12, the charge signals of the lowest row of the imaging section 1 are transferred by applying one pulse to the electrodes $PE_1$ and $PE_1'$ *in a manner such that the Cy signal, G signal, and Ye* signal are transferred into areas 102, 101, and 100 in the distributing section 1a, respectively.

Then, by applying one pulse to the electrode PG, the charges in the areas 100 to 102 are respectively transferred to areas 103, 102, and 104. Further, by applying one pulse to the electrode PG, the charges in the areas 103, 102 and 104 are transferred to areas 102, 104 and 105. By further applying one pulse to PG, the charges in the areas 102, 104 and 105 are transferred to areas 104, 105 and 106.

In this state, the signals of the lowest row of the imaging section 1 are respectively distributed to the horizontal shift registers 2a to 2c for every color and stored therein.

Thereafter, by applying $\phi_{SH}$ to the transfer electrodes $P_{SH}$ in the registers 2a to 2c, the signals in the areas 104 to 106 are transferred to areas 107 to 109 in response to the first pulse. In a manner similar to the above, the charges are sequentially transferred. In this embodiment, the electrodes of the distributing section and horizontal shift registers are formed to have such thicknesses that they can cope with the driving pulses of a few MHz frequency. Thus, even if the electrode of the imaging section is thinly formed, the charges can be horizontally read out at a high speed.

Figure 13:
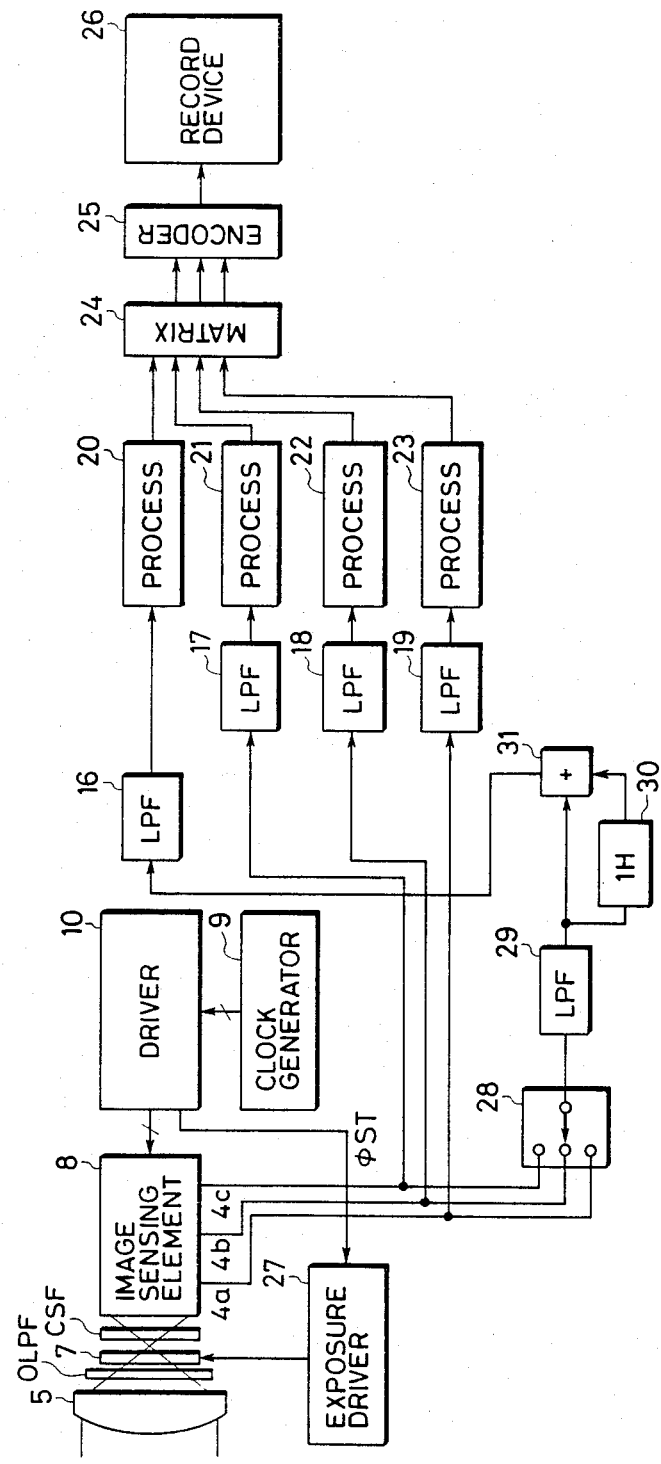
FIG. 13 is a diagram showing an arrangement example of an image sensing apparatus using the image sensing element of FIG. 11.

FIG. 13 is a diagram showing an example of an arrangement of an image sensing apparatus using the image sensing element as shown in FIG. 11, in which the same parts and elements as those shown in FIG. 2 are designated by the same reference numerals. The respective chrominance signals outputted through the output terminals 4a to 4c are directly inputted to the low-pass filters 17 to 19 and are processed.

The signals of the output terminals 4a to 4c are selectively switched at the timings for every pixel by a switching circuit 28 and are returned to the dot sequential signal. Thereafter, they are inputted to a low-pass filter (LPF) 29 and the switching noise is removed. An output of the LPF 29 is delayed by a 1H delay circuit 30 and then inputted to an adding circuit 31. This delayed output is added to the output of the LPF 29 by the adding circuit 31.

The horizontal shift registers 2a to 2c read out the charges at the readout timings delayed by the time lag corresponding to 3/2 pixel bit for every 1H. Therefore, the Cy, Ye and G signals of which the resolutions have been doubled due to the vertical correlation are derived as an output of the adding circuit 31. Thus, after cutting out the high frequency component of the output of the adding circuit 31 by means of a LPF 16, by outputting this output, the luminance signal of a high resolution can be obtained.

The adding circuit 31 may be replaced by a switching circuit which is switched due to ½ pixel bit.

With this arrangement as shown in FIG. 13, the chrominance signals whose levels of Ye, G and Cy are substantially coincident can be reproduced at the pitch of further ½ of the pitch of the color filters. The resolution can be improved to be about six times that in the conventional case with respect to a white and black object.

In this embodiment, after the Y signal is formed by means of the switching of the switching circuit 28, it is subjected to the vertical correlation process by the 1H delay circuit 30 and adding circuit 31, thereby increasing the resolution. However, the resolution can be also sufficiently increased using only one of them.

Figure 14A:
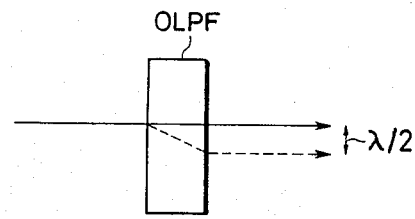
FIGS. 14A and 14B are diagrams showing arrangement examples of optical low-pass filters OLPFs.
Figure 14B:
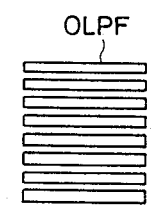

FIGS. 14A and 14B are diagrams showing examples of arrangements of optical low-pass filters OLPFs.

FIG. 14A is a diagram showing an example using a crystal birefringent plate. FIG. 14B is a diagram showing an example using a diffraction grating.

In any of these cases, the optical low-pass filters are set such as to vertically deviate the image by only an amount of ½ of the pixel pitch λ.

In this embodiment, there is no need to use another optical low-pass filter OLPF to deviate the image with respect to the horizontal direction. By merely providing only the OLPF in the vertical direction, the moires in both the horizontal and vertical directions can be reduced.

Figure 15:
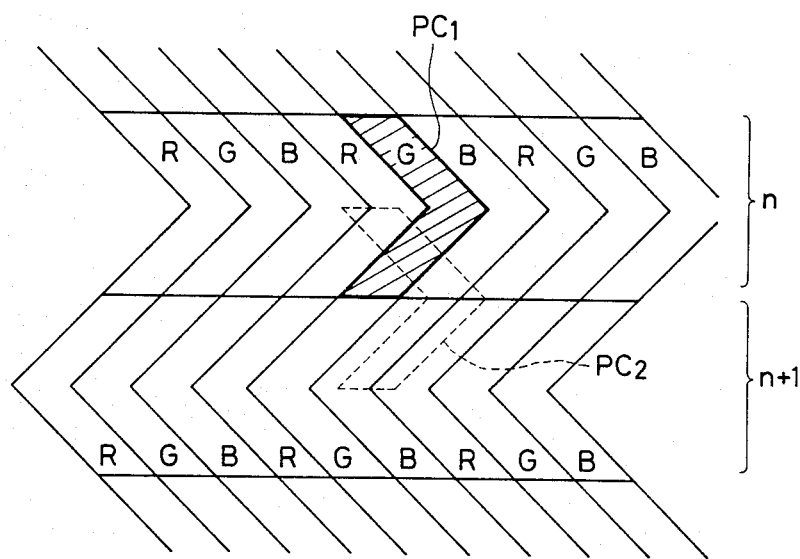
FIG. 15 is a diagram showing an example of a color filter suitable for the embodiment shown in FIGS. 7 and 8.

This point will now be described in detail with reference to FIG. 15 with regard to an example of the image sensing element in the embodiment shown in FIGS. 7 and 8. The image formed on the pixel $PC_1$ of the image sensing element among the images which are obtained through the optical low-pass filter OLPF is also simultaneously formed at the position of the pixel $PC_2$.

Therefore, the high frequency component corresponding to the pixel pitch in the vertical direction of the object image is reduced and moire due to the component of the image near this frequency decreases.

Further, in the image sensing element as in the embodiment of the invention, the sensitivity distribution of the respective pixels horizontally overlaps with the sensitivity distribution of the adjacent pixel in the horizontal direction and also overlaps in the vertical direction. Therefore, the high frequency component corresponding to the horizontal pixel pitch of the object image also causes to be indistinct and decreases due to the deviation of the object image in the vertical direction.

As described above, the effect of the spatial low-pass filter can be provided in the horizontal and vertical directions by the optical low-pass filter in the vertical direction. Thus, the image of a high quality having little pseudo signal can be obtained by an extremely simple constitution.

We claim:

1. An image sensing apparatus comprising:
   an image sensing element which has a plurality of pixels arranged in rows and columns to sense an optical image, the centers of sensitivities of the pixels being deviated in a row direction by only an amount of ½ pitch between adjacent rows; and
   an optical low-pass filter arranged in front of said plurality of pixels, said low-pass filter being constituted such as to gradate an optical image only in a direction perpendicular to said row direction, wherein said optical low-pass filter allows said image sensing element to form double images which are deviated by only an amount of ½ of a pitch in a column direction.

2. An image sensing apparatus according to claim 1, wherein said plurality of pixels of the same column each constitute a charge shift register.

3. An image sensing apparatus according to claim 2, wherein each said charge shift register is separated by a channel stop region.

4. An image sensing apparatus according to claim 3, further comprising color filter means arranged in front of said plurality of pixels, said color filter means having a plurality of color filter elements, a color filter element of a respective predetermined single color corresponding to each of said charge shift registers.

5. An image sensing apparatus according to claim 3, wherein said channel stop regions meander such that centers of sensitivities of the associated pixels meander in the row direction by not more than half the pitch between adjacent rows.

6. An image sensing apparatus according to claim 4, wherein the respective pixels are mutually deviated by an amount of ½ pitch with respect to the adjacent rows, said color filters are arranged for each respective pixel, and said color filters consist of a repetition of three colors in the horizontal direction and are mutually deviated by an amount of 3/2 pitch with regard to the adjacent rows in a column direction.

7. An image sensing element according to claim 4, wherein each of said color filter means consists of a repetition of a plurality of kinds of color filter element.

8. An image sensing element according to claim 4, further comprising color filter means arranged in front of said image sensing element, said color filter means having a plurality of color filter elements in which the color filter element of predetermined single color corresponds to each of said pixels.

9. An image sensing apparatus according to claim 1, wherein said optical low-pass filter includes a crystal plate.

10. An image sensing apparatus according to claim 1, wherein said optical low-pass filter includes a diffraction grating.

* * * * *

UNITED STATES PATENT AND TRADEMARK OFFICE
CERTIFICATE OF CORRECTION

PATENT NO. : 4,870,495

DATED : September 26, 1989

INVENTOR(S) : TAKAO KINOSHITA ET AL.    Page 1 of 3

It is certified that error appears in the above-identified patent and that said Letters Patent is hereby corrected as shown below:

AT [57] ABSTRACT

Line 16, "page" should read --image--.

SHEET 1 OF 13

FIG. 2, "PROCESS" (all occurrences) should read --PROCESSOR--.

SHEET 12 OF 13

FIG. 13, "PROCESS" (all occurrences) should read --PROCESSOR--.

COLUMN 1

Line 6, "FILED" should read --FIELD-- and "INVENITON" should read --INVENTION--.
    Line 14, "outputs" should read --output--.
    Line 21, "solid" should read --solid---.
    Line 58, "comprises:" should read --comprises--.
    Line 59, "parallel" should read --parallel,--.
    Line 62, "means" should read --means,--.
    Line 66, "means" should read --means,--.

UNITED STATES PATENT AND TRADEMARK OFFICE
CERTIFICATE OF CORRECTION

PATENT NO. : 4,870,495

DATED : September 26, 1989

INVENTOR(S) : TAKAO KINOSHITA ET AL.

It is certified that error appears in the above-identified patent and that said Letters Patent is hereby corrected as shown below:

COLUMN 2

Line 9, "pixel," should read --pixels,--.
    Line 10, "(now)" should read --(row)--.
    Line 29, "pixels" should read --pixels,--.
    Line 34, "cahrge" should read --charge--.
    Line 39, "the each column" should read --each column,--.

COLUMN 6

Line 49, "pseudo chromi-" should read --pseudo-chromi---.

COLUMN 8

Line 36, "sesitivity" should read --sensitivity--.
    Line 49, "retisters 2a to 2c," should read --registers 2a to 2c,--.
    Line 53, "ered an" should read --ered and an--.
    Line 68, italics should be deleted.

COLUMN 9

Line 1, italics should be deleted.
    Line 50, "a" should read --the--.
    Line 51, "the" should read --a--.

COLUMN 10

Line 10, "the moires" should read --moire--.

UNITED STATES PATENT AND TRADEMARK OFFICE
CERTIFICATE OF CORRECTION

PATENT NO. : 4,870,495

DATED : September 26, 1989

INVENTOR(S) : TAKAO KINOSHITA ET AL.   Page 3 of 3

It is certified that error appears in the above-identified patent and that said Letters Patent is hereby corrected as shown below:

COLUMN 12

Line 3, "element." should read --elements.--.
Line 8, "of predetermined" should read
--of a predetermined--.

Signed and Sealed this

Twenty-third Day of July, 1991

Attest:

HARRY F. MANBECK, JR.

*Attesting Officer*   *Commissioner of Patents and Trademarks*